United States Patent
Kim

(10) Patent No.: US 10,667,382 B2
(45) Date of Patent: May 26, 2020

(54) ELECTROMAGNETIC SHIELDING STRUCTURE OF SOLID STATE DRIVE

(71) Applicants: Mega electronics Co., Ltd., Ansan-si, Gyeonggi-do (KR); Sunsystem Co., Ltd., Seongnam-si, Gyeonggi-do (KR)

(72) Inventor: Jong Myung Kim, Yongin-si (KR)

(73) Assignees: Mega electronics Co., Ltd., Ansan-si, Gyeonggi-do (KR); Sunsystem Co., Ltd., Seongnam-si, Gyeonggi-do (KR)

(*) Notice: Subject to any disclaimer, the term of this patent is extended or adjusted under 35 U.S.C. 154(b) by 0 days.

(21) Appl. No.: 16/389,990

(22) Filed: Apr. 21, 2019

(65) Prior Publication Data
US 2019/0357347 A1    Nov. 21, 2019

(30) Foreign Application Priority Data
May 16, 2018   (KR) .................. 10-2018-0056064

(51) Int. Cl.
*H05K 1/00* (2006.01)
*H05K 1/02* (2006.01)
*H05K 9/00* (2006.01)

(52) U.S. Cl.
CPC ......... *H05K 1/0222* (2013.01); *H05K 9/0081* (2013.01)

(58) Field of Classification Search
USPC ........................................ 361/748
See application file for complete search history.

(56) References Cited

U.S. PATENT DOCUMENTS

2013/0313724 A1* 11/2013 Joblot .............. H01P 3/003
257/774
2015/0348936 A1* 12/2015 Lin ................. H01L 23/552
257/659

FOREIGN PATENT DOCUMENTS

KR   10-2018-0000668 A1   1/2018

* cited by examiner

*Primary Examiner* — Andargie M Aychillhum
(74) *Attorney, Agent, or Firm* — Revolution IP, PLLC

(57) ABSTRACT

Disclosed is an electromagnetic shielding structure of a solid state driver (SSD), and particularly an electromagnetic shielding structure of an SSD, in which an electromagnetic shielding structure of a closed shield can type is achieved based on an electromagnetic shielding structure that employs an electromagnetic shielding coating layer electrically connected to a ground via hole formed in a printed circuit board (PCB) and a lower electromagnetic shielding layer formed inside the PCB and electrically connected to the electromagnetic shielding coating layer through the ground via hole, thereby improving electromagnetic shielding performance.

1 Claim, 8 Drawing Sheets

(a)

(b)

US 10,667,382 B2

ELECTROMAGNETIC SHIELDING STRUCTURE OF SOLID STATE DRIVE

CROSS-REFERENCE TO RELATED APPLICATION

This application claims priority from Korean Patent Application No. 10-2018-0056064, filed on May 16, 2018 in the Korean Intellectual Property Office, the disclosure of which is incorporated herein by reference.

BACKGROUND OF THE INVENTION

(a) Field of the Invention

The disclosure relates to an electromagnetic shielding structure of a solid state drive (SSD), and more particularly to an electromagnetic shielding structure of an SSD, in which an electromagnetic shielding structure of a closed shield can type is achieved based on an electromagnetic shielding structure that employs an electromagnetic shielding coating layer electrically connected to a ground via hole formed in a printed circuit board (PCB) and a lower electromagnetic shielding layer formed inside the PCB and electrically connected to the electromagnetic shielding coating layer through the ground via hole, thereby improving electromagnetic shielding performance.

(b) Description of the Related Art

A conventional general solid state drive (SSD) includes a flash memory; a controller for controlling the flash memory; power components to control a variety of power for the SSD; passive elements such as a resistor, a capacitor, a coil, etc. to stabilize each power of the controller and the flash memory and a logic function; a printed circuit board (PCB) onto which various components such as the flash memory for storing data is mounted; and a connector for power connection and data connection of the SSD.

The electromagnetic shielding structure for the SSD, proposed in Korean Patent Publication No. 10-2018-0000668, refers to an electromagnetic shielding structure for the top and lateral portions of the PCB. However, impact of electromagnetic waves on the bottom portion of the PCB is not negligible, and it is advantageous to avoid impact of external interference from the bottom portion in terms of maintaining performance. Therefore, the electromagnetic shielding structure is needed for not only the top and lateral portions of the PCB but also the bottom portion in order to achieve a completely closed electromagnetic shielding structure. In other words, a conventional shielding structure for the SSD cannot attain a complete electromagnetic shielding structure of a closed shield can type, and thus it is impossible to guarantee the performance and efficiency of the electromagnetic shielding structure.

SUMMARY OF THE INVENTION

Accordingly, the disclosure is conceived to solve the foregoing problems, and an aspect of the disclosure is to provide an electromagnetic shielding structure of a solid state drive (SSD), in which an electromagnetic shielding structure of a closed shield can type is achieved based on an electromagnetic shielding structure that employs an electromagnetic shielding coating layer electrically connected to a ground via hole formed in a printed circuit board (PCB) and a lower electromagnetic shielding layer formed inside the PCB and electrically connected to the electromagnetic shielding coating layer through the ground via hole, thereby improving electromagnetic shielding performance.

In accordance with an embodiment of the disclosure, there is provided an electromagnetic shielding structure of a solid state drive (SSD) including a printed circuit board (PCB), a plurality of memories mounted to the PCB, a controller, and a plurality of active and passive elements, the electromagnetic shielding structure including: a molding resin layer formed on the PCB and covering and surrounding the plurality of memories, the controller, and the plurality of active and passive elements; an electromagnetic shielding coating layer coated on a surface of the molding resin layer and electrically connected to a ground via hole continuously formed along an edge portion of the PCB; and a lower electromagnetic shielding layer formed inside the PCB and electrically connected to the electromagnetic shielding coating layer through the ground via hole.

BRIEF DESCRIPTION OF THE DRAWINGS

The above and/or other aspects of the disclosure will become apparent and more readily appreciated from the following description of the exemplary embodiments, taken in conjunction with the accompanying drawings, in which.

DETAILED DESCRIPTION

Below, embodiments of an electromagnetic shielding structure of a solid state drive (SSD) according to the disclosure with the foregoing objects, solutions, and effects will be described in detail with reference to the accompanying drawings.

Referring to FIGS. 1 to 5, a key point of an SSD 100 according to an embodiment of the disclosure is to include an electromagnetic shielding structure proposed according to the disclosure, and specifically include an electromagnetic shielding structure 40 of a closed shield can type.

Figure 1:
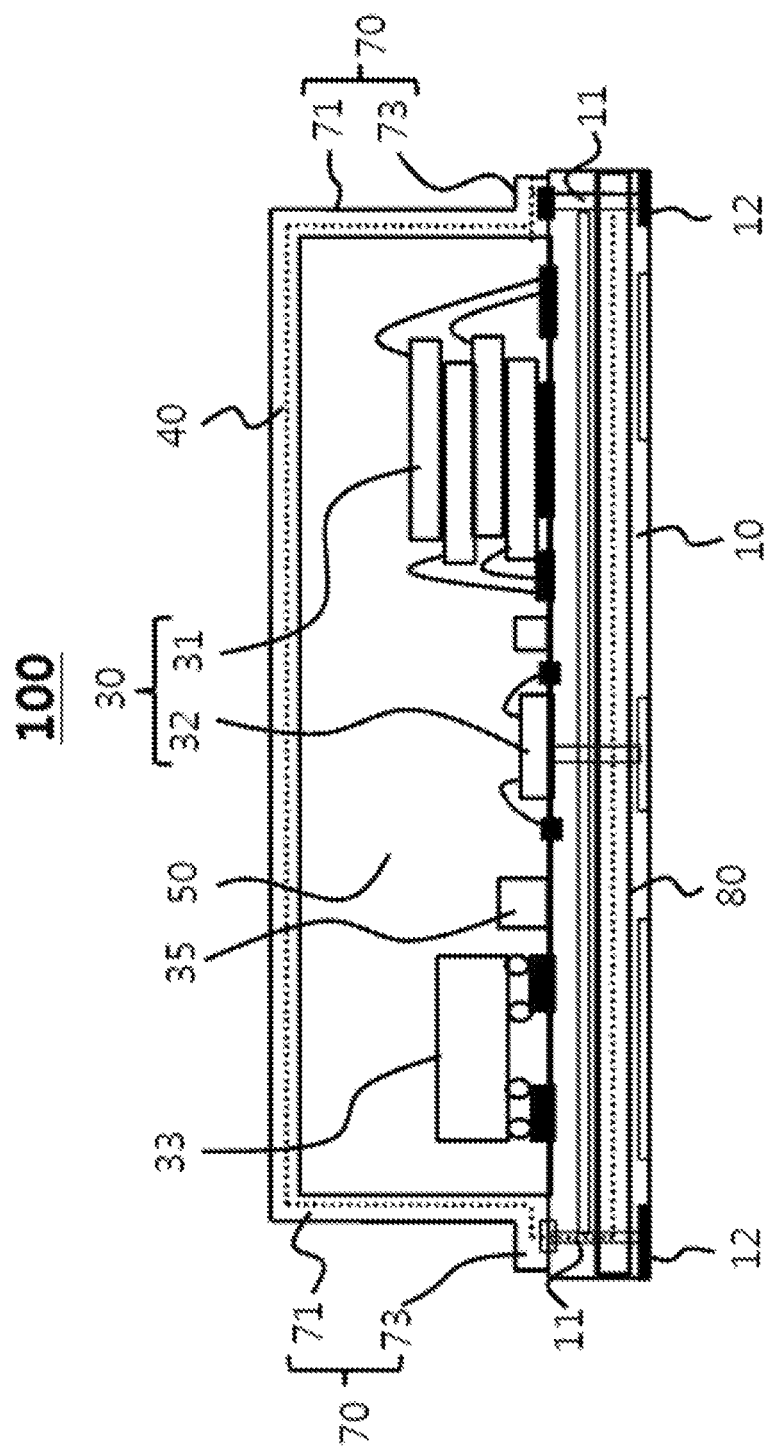
FIG. 1 is a cross-sectional view of a solid state drive (SSD) according to an embodiment of the disclosure.

In more detail, the SSD 100 according to an embodiment of the disclosure the SSD 100 is characterized in including the electromagnetic shielding structure 40 of the closed shield can type shown in FIG. 1. To this end, an electromagnetic shielding coating layer 70 coated on a molding resin layer 50 and a lower electromagnetic shielding layer 80 formed inside a printed circuit board (PCB) 10 are electrically connected through a ground via hole 11 formed along an edge portion of the PCB 10, thereby forming a closed shielding structure.

Figure 2:
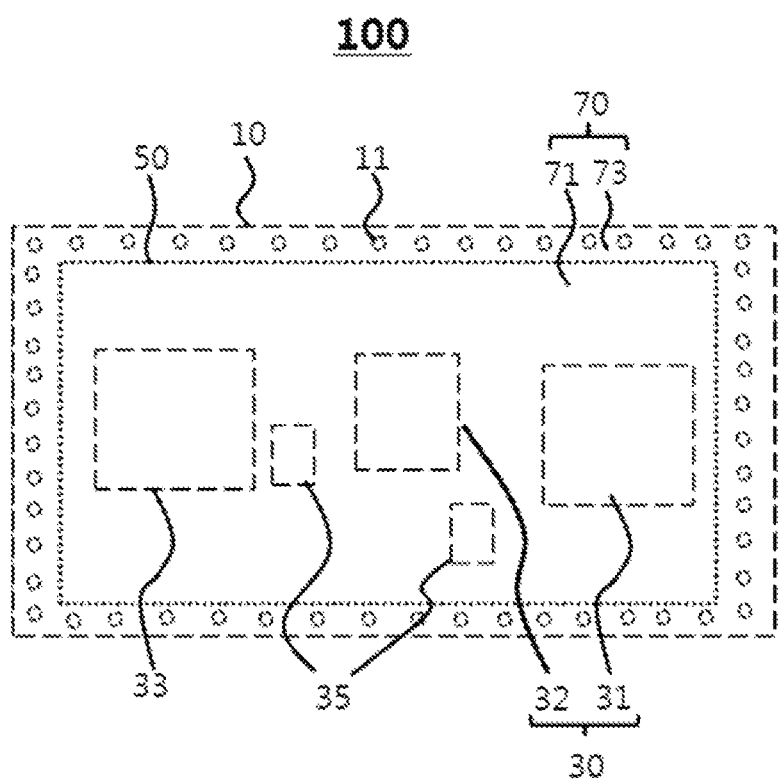
FIG. 2 is a schematic plan view of the SSD shown in FIG. 1.
Figure 3:
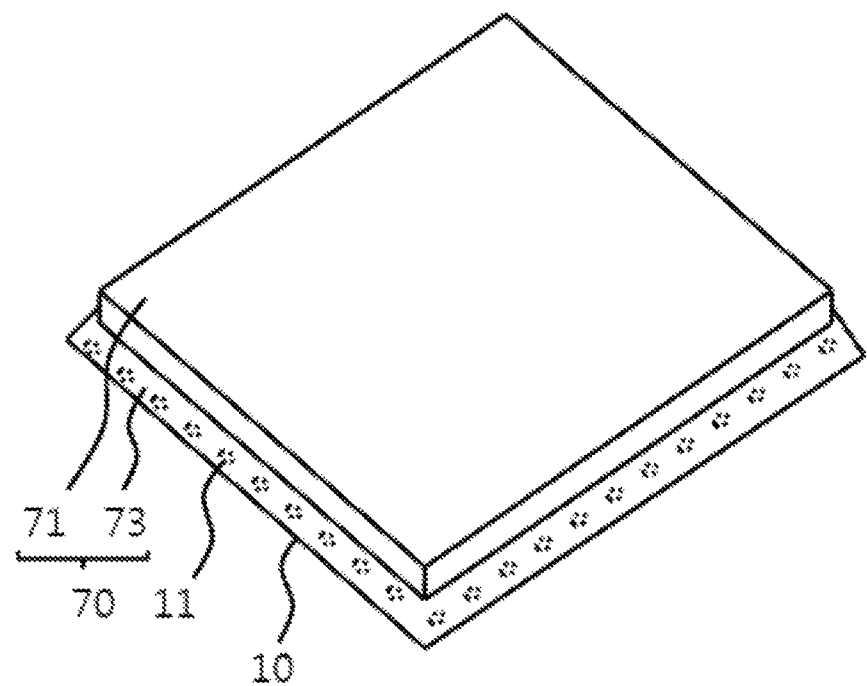
FIG. 3 is a schematic perspective view of the SSD shown in FIG. 1.

As shown in FIGS. 1 to 3, the SSD 100 with the electromagnetic shielding structure 40 of the closed shield can type according to an embodiment of the disclosure includes the PCB 10 onto which various circuit elements 30, 31, 32, 33, 35 are mounted; and various circuit elements, i.e. a plurality of memories 30, a controller 33, and a plurality of active and passive elements 35, to be mounted onto the PCB 10.

The PCB 10 of the SSD 100 is mounted with a plurality of memories 30 such as a flash memory 31, a double data rate (DDR) memory 32, etc.; the controller 33; and the plurality of active and passive elements 35. For example, the plurality of memories 30 including a plurality of stacked flash memories 31 and the DDR memory 32 are mounted to one side on the top surface of the PCB 10, and the controller 33 and the passive elements 35 are mounted to the other side on the top surface. Of course, the passive elements 35 may be mounted to one side on the top surface.

The SSD 100 according to the disclosure employs technical features for forming the electromagnetic shielding structure 40 of the closed shield can type. Specifically, the disclosure includes the molding resin layer 50 formed on the PCB 10 to hold and protect circuit elements, the electromagnetic shielding coating layer 70 coated on the surface of the molding resin layer 50 and shielding the top and lateral portions of the PCB 10 against electromagnetic waves, and the lower electromagnetic shielding layer 80 arranged to be electrically connected to the electromagnetic shielding coating layer 70 inside the PCB 10 and shielding the bottom of the PCB 10 against electromagnetic waves, and connects them to achieve the electromagnetic shielding structure 40 of the closed shield can type.

The molding resin layer 50 is made of a nonconductive material, and formed on the PCB 10 to cover and surround the plurality of memories 30 including the flash memories 31 and the DDR memory 32, the controller 33, and the plurality of active and passive elements 35.

The electromagnetic shielding coating layer 70 is coated on the surface of the molding resin layer 50, and electrically connected to the ground via hole 11 continuously formed along an edge portion of the PCB 10. Specifically, the electromagnetic shielding coating layer 70 may be electrically connected to a plurality of ground via holes 11 formed on the PCB 10, but particularly necessarily formed to be electrically connected to the ground via hole 11 formed along the edge portion of the PCB 10.

It is natural that the ground via hole 11 to be electrically connected to the electromagnetic shielding coating layer 70 is filled with a conductive material. Further, the ground via hole 11 may be connected to a ground line formed inside the PCB 10, and electrified connecting with a ground pad 12 formed on the bottom of the PCB 10. Eventually, the electromagnetic shielding coating layer 70 is connected to the ground pad 12 through the ground via hole 11 filled with the conductive material and maintains a ground state, thereby performing an electromagnetic shielding function.

Meanwhile, the plurality of memories 30 including the flash memories 31 and the DDR memory 32, the controller 33, and the plurality of active and passive elements 35 electrically connect and interface with each other by a circuit signal line and interface line formed inside the PCB 10 as they are mounted onto the PCB 10 as described above.

Further, the PCB 10 may be internally formed with the ground via holes 11 and additionally formed with the ground line for connecting the ground via holes 11 with each other. On the bottom of the PCB, the ground pad 12 is formed to be electrified connecting with the ground via hole 11. The electromagnetic shielding coating layer 70, the ground via hole 11 and the ground line are electrically connected through the ground pad 12, thereby forming a shielding ground line.

The ground via hole 11 formed vertically penetrating the PCB 10 may be formed at various positions as long as it can electrically connect with the electromagnetic shielding coating layer 70. However, the ground via hole 11 may include the ground via hole 11 formed continuously along the edge portion of the PCB 10 as shown in FIGS. 2 and 3.

The ground via hole 11 in the electromagnetic shielding structure 40 of the closed shield can type is formed in the edge portion of the PCB 10, and the molding resin layer 50 is formed in only an inner portion except the edge portion of the PCB 10 where the ground via hole 11 is formed in the electromagnetic shielding structure 40 of the closed shield can type.

Eventually, the ground via hole 11 in the electromagnetic shielding structure 40 of the closed shield can type formed in the edge portion of the PCB 10 is not covered with the molding resin layer 50 but exposed to the outside. In this state, the electromagnetic shielding coating layer 70 is coated on the surface of the molding resin layer 50, and subsequently the electromagnetic shielding coating layer 70 is electrically connected to the ground via hole 11.

According to the disclosure, the electromagnetic shielding coating layer 70 includes a basic electromagnetic shielding coating layer 71 coated on the top and lateral sides of the molding resin layer 50, and an extended electromagnetic shielding coating layer 73 extended from the basic electromagnetic shielding coating layer 71 and coated on the edge portion of the PCB 10.

The basic electromagnetic shielding coating layer 71 and the extended electromagnetic shielding coating layer 73 of the electromagnetic shielding coating layer 70 are formed at a time by a single coating process, and the extended electromagnetic shielding coating layer 73 is formed on the edge portion of the PCB 10 so as to overlap with the ground via hole 11 filed with the conductive material in the electromagnetic shielding structure 40 of the closed shield can type.

The ground pad 12 formed at an outer portion on the bottom of the PCB 10 is continuously formed in the edge portion of the PCB 10 and electrified connecting with the electromagnetic shielding coating layer 73 formed on the top of the PCB 10 through the ground via hole 11 in the electromagnetic shielding structure 40 of the closed shield can type. The ground pad 12 is provided as an input/output interface pin in the form of a land grid array (LGA) or a ball grid array (BGA), so that the SSD according to the disclosure can be finally mounted to a system board.

To achieve the electromagnetic shielding structure 40 of the closed shield can type, the disclosure includes the lower electromagnetic shielding layer 80 formed inside the PCB 10, and electrically connected to the electromagnetic shielding coating layer 70 through the ground via hole 11 (i.e. the ground via holes formed along the edges of the PCB 10) in the electromagnetic shielding structure 40 of the closed shield can type.

The lower electromagnetic shielding layer 80 is not attached to the bottom of the PCB 10 but formed inside the PCB 10 throughout the entire surface so as to protect itself. Like this, the lower electromagnetic shielding layer 80 is formed throughout the entire inner surface of the PCB 10, and therefore applies the electromagnetic shielding to the bottom of the PCB 10 while maintaining basic protection against external impact (shock, water, heat, etc.), thereby achieving the electromagnetic shielding structure 40 of the closed shield can type.

The lower electromagnetic shielding layer 80 is necessarily formed to electrically contact the ground via hole 11 in the electromagnetic shielding structure 40 of the closed shield can type, i.e. the ground via hole 11 continuously formed along the edge of the PCB 10, and electrically connected to the electromagnetic shielding coating layer 70 through the ground via hole 11 in the electromagnetic shielding structure 40 of the closed shield can type, thereby completing the electromagnetic shielding structure 40 of the closed shield can type.

As such, the lower electromagnetic shielding layer 80 for achieving the electromagnetic shielding structure 40 of the closed shield can type is basically protected since it is formed inside the PCB 10, but may be autonomously protected against external environments and further have a structure for stable contact with the ground via hole 11 by its own configuration.

Figure 4:
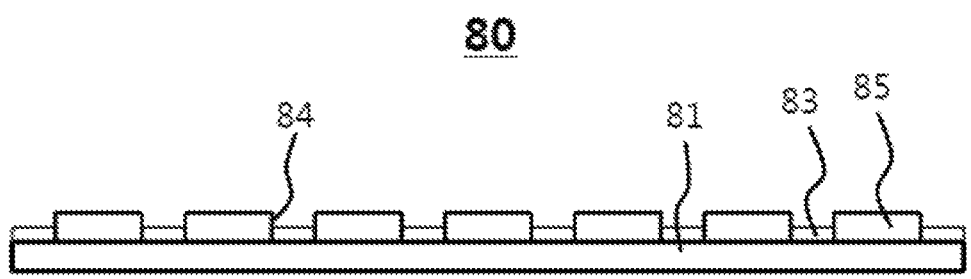
FIG. 4 is a schematic cross-sectional view of a lower electromagnetic shielding layer in an electromagnetic shielding structure of the SSD shown in FIG. 1.
Figure 4:
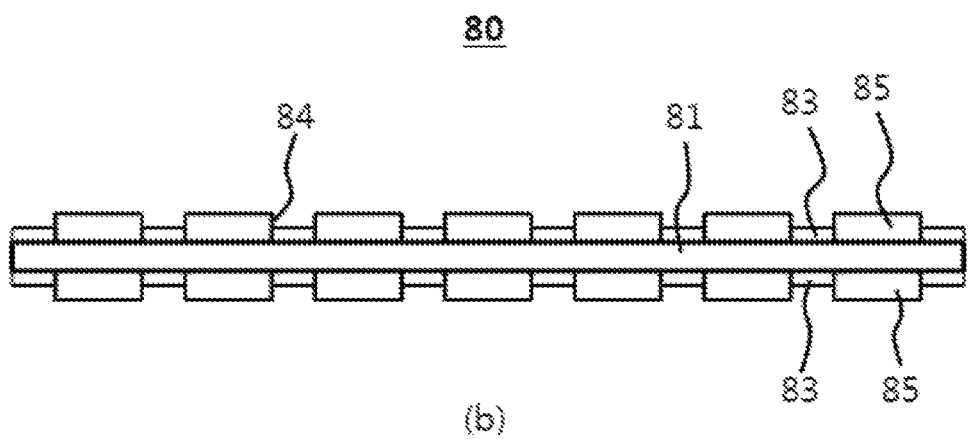
Figure 5:
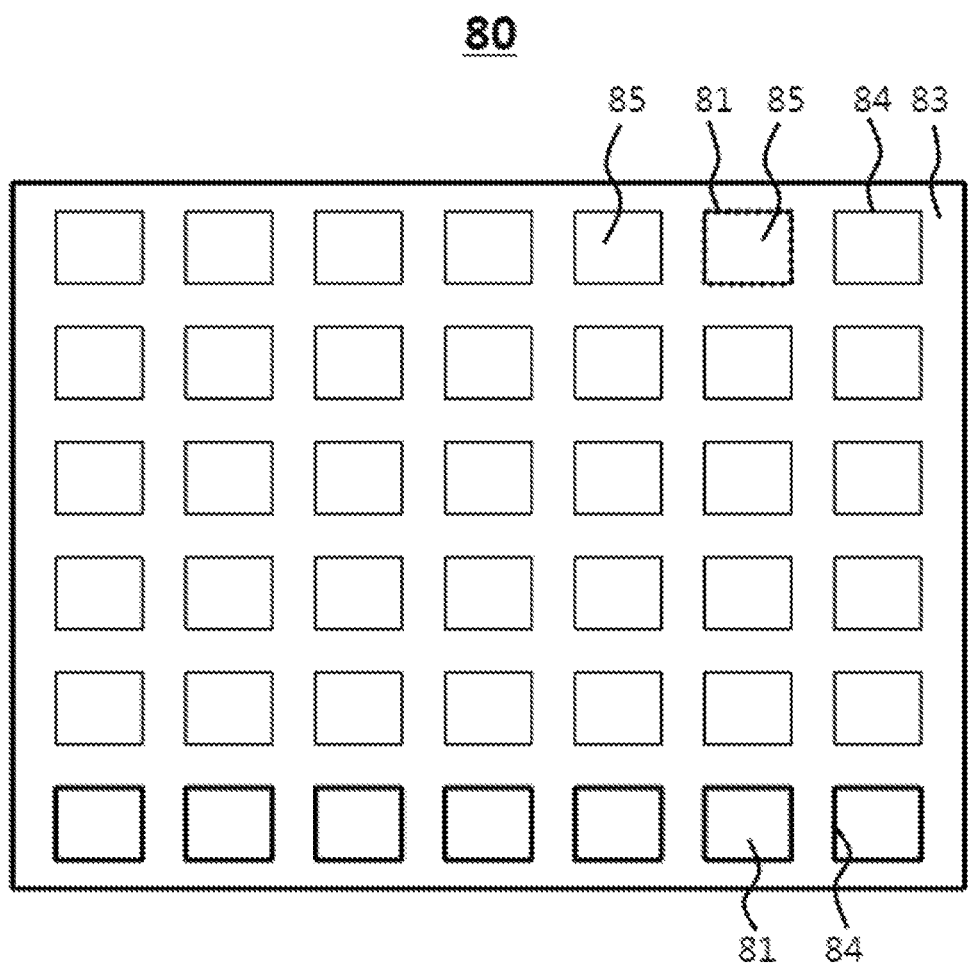
FIG. 5 is a schematic plan view of the lower electromagnetic shielding layer in an electromagnetic shielding structure of the SSD shown in FIG. 1.

The lower electromagnetic shielding layer 80 for this purpose is illustrated in FIGS. 4 and 5. FIG. 4 is a schematic cross-sectional view of the lower electromagnetic shielding layer 80 according to the disclosure, and FIG. 5 is a schematic plan view of the lower electromagnetic shielding layer 80 according to the disclosure.

Further, (a) in FIG. 4 shows a schematic cross-sectional view of the lower electromagnetic shielding layer 80, in which a plurality of lower shielding metal pads 85 are formed on only the top surface of a lower shielding metal thin film 81, and (b) of FIG. 4 shows a schematic cross-sectional view of the lower electromagnetic shielding layer 80, in which the plurality of lower shielding metal pads 85 are formed on both the top and bottom surfaces of the lower shielding metal thin film 81. In addition, FIG. 5 shows that a lower shielding resin thin film 83 formed with a lower shielding opening 84 is coated on the lower shielding metal thin film 81 (to be described later), in which some lower shielding openings 84 are filled with the lower shielding metal pads 85 but the other lower shielding openings 84 are not filled with the lower shielding metal pad and thus expose the lower shielding metal thin film 81 therethrough.

As shown in FIGS. 4 and 5, the lower electromagnetic shielding layer 80 according to an embodiment of the disclosure basically includes the lower shielding metal thin film 81; the lower shielding resin thin film 83 coated on at least one of the top and bottom surfaces of the lower shielding metal thin film 81 and formed with the plurality of lower shielding openings 84; and the plurality of lower shielding metal pads 85 filled and coated in the plurality of lower shielding openings 84 and being in contact with the lower shielding metal thin film 81.

Specifically, the lower electromagnetic shielding layer 80 according to an embodiment of the disclosure includes the lower shielding metal thin film 81 formed inside the PCB 10 throughout the entire surface and shaped like a plate. The lower shielding metal thin film 81 is formed like a plate throughout the entire surface of the PCB 10 so as to have the same area as that of the PCB 10.

If the lower electromagnetic shielding layer 80 includes only the lower shielding metal thin film 81, the lower shielding metal thin film 81 has a problem of being damaged or deteriorated by external impact because it may be exposed to and permeated with humidity or water and exposed to heat generated in itself or transferred heat. In this case, there are shortcomings that the performance the electromagnetic shielding structure 40 of the closed shield can type has is gradually deteriorated.

To solve such problems and short comings, the lower electromagnetic shielding layer 80 according to the disclosure includes the lower shielding resin thin film 83 formed as coated on the lower shielding metal thin film 81. Meanwhile, the lower shielding metal thin film 81 has to electrically connect with the ground via hole 11 in the electromagnetic shielding structure 40 of the closed shield can type. To this end, the lower shielding resin thin film 83 is coated on the surface of the lower shielding metal thin film 81 while partially exposing the lower shielding metal thin film 81.

Specifically, the lower electromagnetic shielding layer 80 according to the disclosure includes the lower shielding resin thin film 83 coated on the lower shielding metal thin film 81 and formed with the plurality of lower shielding openings 84 spaced apart from one another to expose the lower shielding metal thin film 81. That is, the lower shielding resin thin film 83 having the plurality of lower shielding openings 84 is coated on the lower shielding metal thin film 81, and the plurality of lower shielding openings 84 are arrayed leaving a predetermined space from one another.

The plurality of lower shielding openings 84 is filled with the lower shielding metal pads 85 to be in electric contact with the lower shielding metal thin film 81. In other words, the lower electromagnetic shielding layer 80 according to the disclosure includes the plurality of lower shielding metal pads 85 respectively filled in the plurality of lower shielding openings 84 and formed to be in contact with the lower shielding metal thin film 81.

Eventually, the bottoms of the lower shielding metal pads 85 are in contact with the lower shielding metal thin film 81. The tops of the lower shielding metal pads 85 formed as above are in contact with and electrically connected to the ground via holes 11. In particular, the lower shielding metal pads 85 are formed along the edge of the PCB 10 and electrically contact and connect with the ground via hole 11 in the electromagnetic shielding structure 40 of the closed shield can type. Meanwhile, the bottom of the lower shielding metal thin film 81 are entirely exposed to the outside, and therefore connected to the ground pad 12 as connected to the ground via hole 11 at a lower side.

Meanwhile, the plurality of lower shielding metal pads 85 may be formed each having a uniform size and arrayed to be equidistantly spaced apart from each other. Eventually, the plurality of lower shielding openings 84 are also formed each having a uniform size and arrayed to be equidistantly spaced apart from each other. The size of the lower shielding metal pad 85 is determined to guarantee stable contact and electric connection with the ground via hole 11 even though the SSD is changed in size or standards. Furthermore, the plurality of lower shielding metal pads 85 are required to be arrayed leaving the same distance from each other. To this end, each lower shielding metal pad 85 may have a width of 33 μm and a length of 33 μm, and a distance between the adjacent lower shielding metal pads 85 may be 16 μm.

In the lower electromagnetic shielding layer 80 shown in (a) of FIG. 4, the bottom of the lower shielding metal thin film 81 is entirely exposed, and thus still affected by external impact and environmental conditions (humidity, moisture, water, heat, etc.).

Accordingly, the lower electromagnetic shielding layer 80 according to the disclosure, as shown in (b) of FIG. 4, includes the lower shielding resin thin film 83 coated on the lower shielding metal thin film 81, particularly on both the top and bottom surfaces of the lower shielding metal thin film 81, and formed with the plurality of lower shielding openings 84 through which the lower shielding metal thin film 81 are exposed at predetermined intervals. Here, the plurality of lower shielding openings 84 are arrayed as spaced apart from each other at the same intervals.

In this case, the lower shielding resin thin film 83 is coated on both surfaces, i.e. the top and bottom surfaces of the lower shielding metal thin film 81, and includes the lower shielding openings 84 arrayed at the same intervals. Even in this case, as shown in (b) of FIG. 4, the lower electromagnetic shielding layer 80 according to the disclosure includes the plurality of lower shielding metal pads 85 respectively filled in the plurality of lower shielding openings 84 and being in contact with the lower shielding metal thin film 81. Here, the plurality of lower shielding metal pads 85 are formed as filled in the lower shielding openings 84 formed on the top and bottom surfaces of the lower shielding metal thin film 81.

Eventually, the plurality of lower shielding metal pads 85 are in contact with and electrically connected to the lower shielding metal thin film 81 at the top and bottom surfaces of the lower shielding metal thin film 81. Therefore, the lower shielding metal pads 85 formed in contact with the top surface of the lower shielding metal thin film 81 are in upward contact and connection with the ground via hole 11 and electrically connected to the electromagnetic shielding coating layer 70, and the lower shielding metal pads 85 formed in contact with the bottom surface of the lower shielding metal thin film 81 are in downward contact and connection with the ground via hole 11 and electrically connected to the ground pad 12.

Like this, as shown in (b) of FIG. 4, the lower shielding resin thin film 83 is coated on the top and bottom surfaces of the shielding metal thin film 81, thereby maximizing the protection and performance of the shielding metal thin film 81 as compared with those in (a) of FIG. 4. Meanwhile, the plurality of lower shielding metal pads 85 applied in this case has the same size and interval as those described with reference to (a) of FIG. 4.

Figure 6:
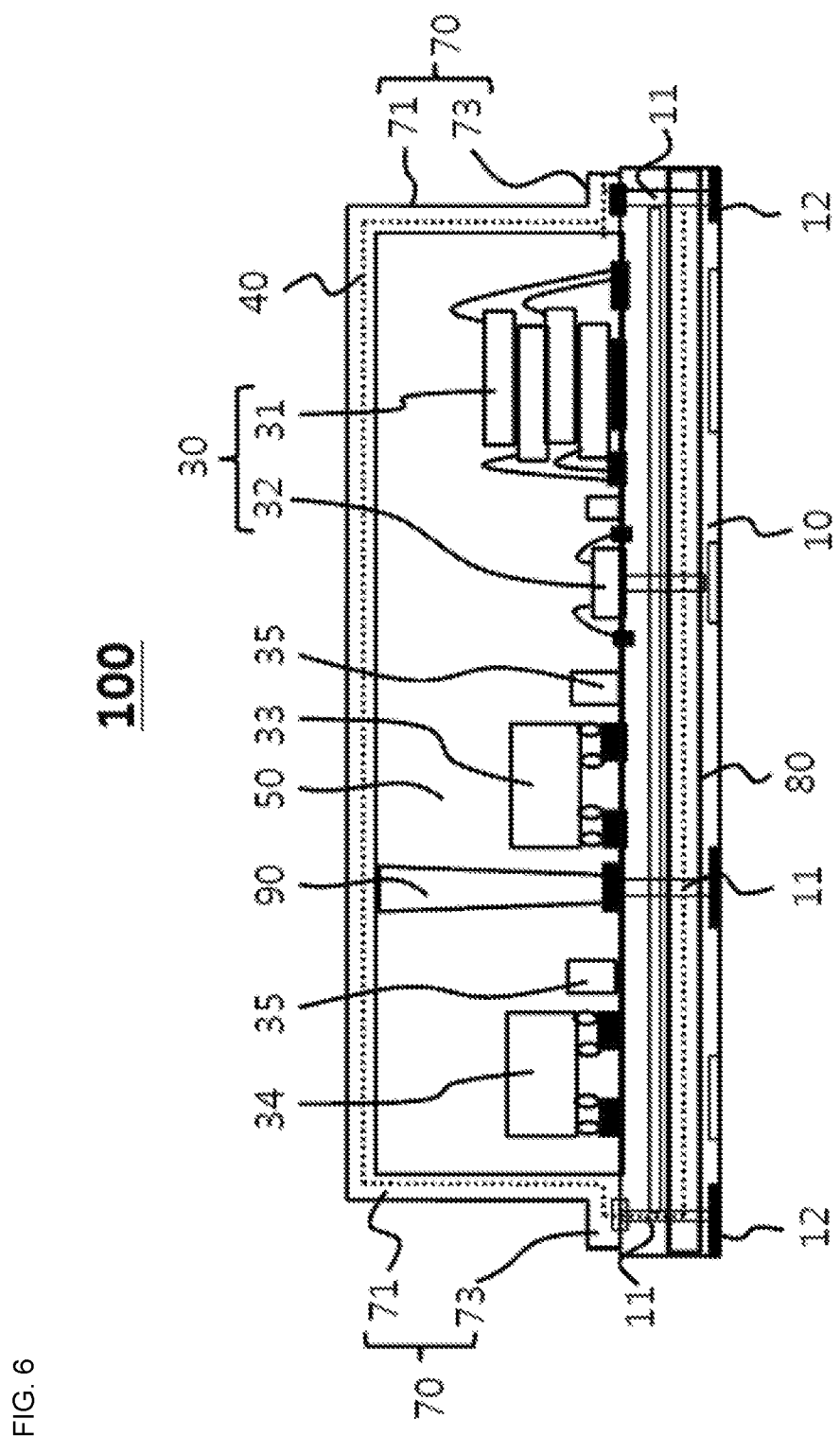
FIG. 6 is a cross-sectional view of an SSD according to another embodiment of the disclosure.

In the SSD according to the disclosure, a communication modem chip 34 for communication based on Wi-Fi, long term evolution (LTE), Bluetooth, etc. may be additionally mounted to the PCB 10 as shown in FIG. 6. The plurality of memories 30 including the plurality of stacked flash memories 31 and the DDR memory 32, the controller 33, the plurality of active and passive elements 35, and the communication modem chip 34 may exchange thermal interference or electromagnetic interference as they are arranged on the PCB 10.

According to the disclosure, the controller 33 is mounted to one side on the top surface of the PCB 10, the communication modem chip 34 is mounted to the other side, and an interference blocker 90 is formed to block electromagnetic interference between the controller 33 and the communication modem chip 34.

Figure 7:
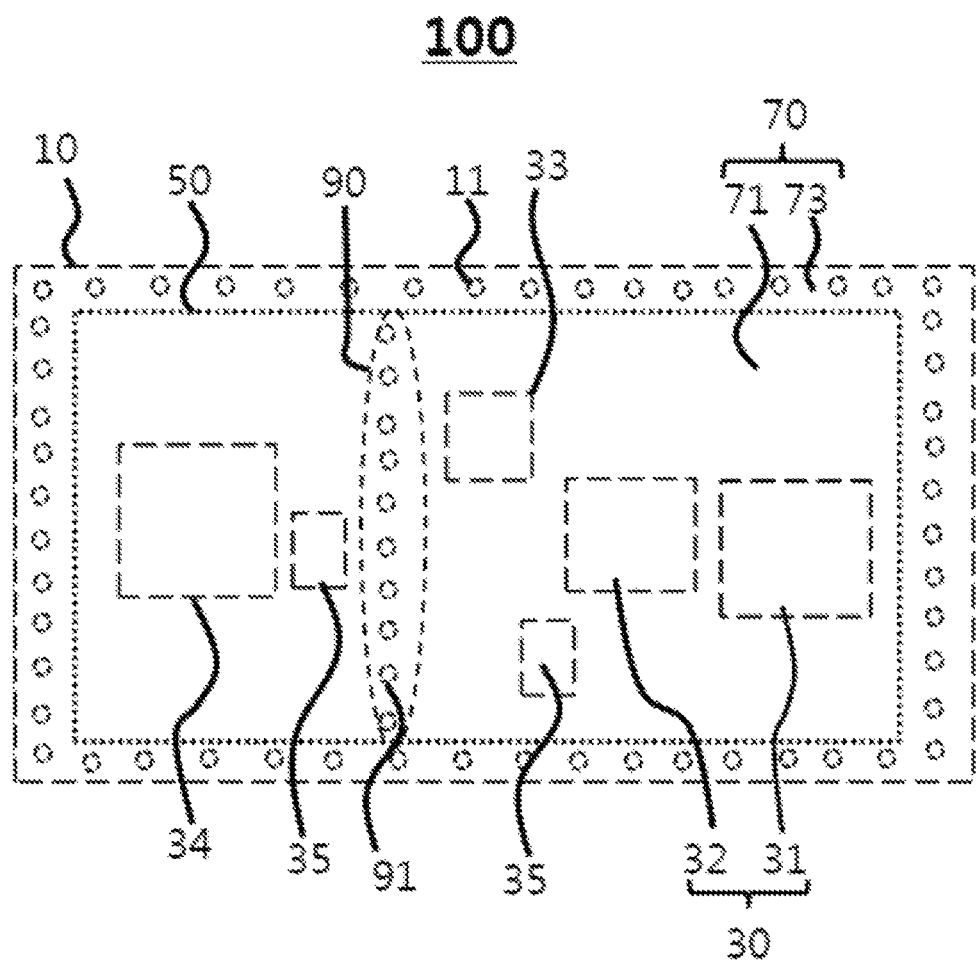
FIG. 7 is a schematic plan view of the SSD shown in FIG. 6.
Figure 8:
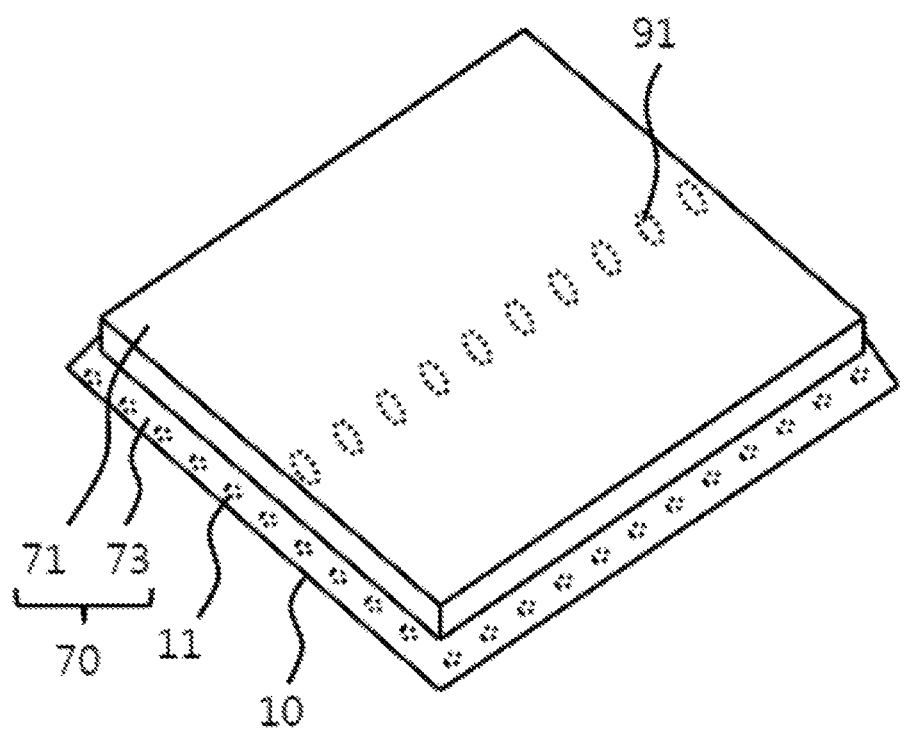
FIG. 8 is a schematic perspective view of the SSD shown in FIG. 6.

Specifically, as shown in FIGS. 6 to 8, the SSD 100 according to an embodiment of the disclosure includes the communication modem chip 34 additionally mounted to the PCB 10, and further includes the interference blocker 90 formed penetrating the molding resin layer 50 so as to spatially divide the top surface of the PCB 10 into one side and the other side and block the electromagnetic interference between the communication modem chip 34 and the controller 33.

The interference blocker 90 may have various structure as long as it can electrically separate an area where the controller 33 is mounted (i.e. a first area) from an area where the communication modem chip 34 is mounted (i.e. a second area) in order to block the electromagnetic interference between the communication modem chip 34 and the controller 33.

Because the electromagnetic shielding coating layer 70 is electrically connected to the lower electromagnetic shielding layer 80 and the ground pad 12 through the ground via hole 11, the interference blocker 90 electrically connected to the electromagnetic shielding coating layer 70 is also electrically connected to the electromagnetic shielding coating layer 70 and the lower electromagnetic shielding layer 80 and further connected to the ground pad 12 through the ground via hole 11, thereby performing the electromagnetic shielding function of the closed shield can type.

As described above, the interference blocker 90 may include a divider plate made of a metal plate or a plastic plate coated with a conductive material. Alternatively, as shown in FIGS. 7 and 8, the interference blocker 90 may include an interference blocking via hole 91 formed penetrating the molding resin layer 50. The interference blocking via hole 91 is continuously formed vertically penetrating the molding resin layer 50 so as to electrically divide the first area and the second area. Of course, the interference blocking via hole 91 filled with a conductive material may be electrically connected to a separate ground via hole formed in the PCB 10 and connected to the ground pad 12 through the lower electromagnetic shielding layer 80 formed inside the PCB 10.

The SSD 100 according to an embodiment of the disclosure shown in FIGS. 6 to 8 is the same as the foregoing SSD shown in FIGS. 1 to 5 except the interference blocker 90 including the interference blocking via hole 91 filled with the conductive material, and thus repetitive descriptions thereof will be avoided.

With the electromagnetic shielding structure of the SSD according to the disclosure for the technical problems and solutions, an electromagnetic shielding structure of a closed shield can type is achieved based on an electromagnetic shielding structure that employs an electromagnetic shielding coating layer electrically connected to a ground via hole formed in a printed circuit board (PCB) and a lower electromagnetic shielding layer formed inside the PCB and electrically connected to the electromagnetic shielding coating layer through the ground via hole, thereby improving electromagnetic shielding performance.

Although embodiments of the disclosure have been described, these are for illustrative purpose only and it will be appreciated by a person having an ordinary skill in the art that various changes and their equivalents may be made in these embodiments. Therefore, the scope of the disclosure is defined in the following claims.

What is claimed is:

1. An electromagnetic shielding structure of a solid state drive (SSD) comprising a printed circuit board (PCB), a plurality of memories mounted to the PCB, a controller, and a plurality of active and passive elements, the electromagnetic shielding structure comprising:

a molding resin layer formed on the PCB and covering and surrounding the plurality of memories, the controller, and the plurality of active and passive elements;

an electromagnetic shielding coating layer coated on a surface of the molding resin layer and electrically connected to a ground via hole continuously formed along an edge portion of the PCB; and a lower electromagnetic shielding layer formed inside the PCB and electrically connected to the electromagnetic shielding coating layer through the ground via hole, wherein the lower electromagnetic shielding layer comprises:
  a lower shielding metal thin film formed inside the PCB throughout an entire surface thereof and shaped like a plate;
  a lower shielding resin thin film coated on top and bottom surfaces of the lower shielding metal thin film and formed with a plurality of lower shielding openings equidistantly spaced apart from each other exposing the lower shielding metal thin film; and
  a lower shielding metal pad filled in each of the plurality of lower shielding openings and formed to be in contact with the lower shielding metal thin film,
wherein the lower shielding metal pad has a width and a length being 33 μm respectively and a distance between adjacent lower shielding metal pads is 16 μm.

* * * * *